US006490077B1

(12) United States Patent
Conradi

(10) Patent No.: US 6,490,077 B1
(45) Date of Patent: Dec. 3, 2002

(54) COMPOSITE OPTICAL AMPLIFIER

(75) Inventor: Jan Conradi, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/717,319

(22) Filed: Nov. 20, 2000

(51) Int. Cl.$^7$ ............................. H01S 3/30; H01S 5/00
(52) U.S. Cl. ................................. 359/334; 359/344
(58) Field of Search ........................................ 359/334

(56) References Cited

U.S. PATENT DOCUMENTS

| 4,922,495 | A |   | 5/1990  | Bobbs et al. ................... 372/3 |
| 4,923,291 | A |   | 5/1990  | Edagawa et al. ........... 350/389 |
| 5,033,051 | A |   | 7/1991  | Werner ........................... 372/3 |
| 5,039,199 | A |   | 8/1991  | Mollenauer et al. ........ 359/334 |
| 5,140,598 | A |   | 8/1992  | Tagawa et al. ................. 372/6 |
| 5,153,762 | A | * | 10/1992 | Huber ........................... 359/125 |
| 5,191,628 | A |   | 3/1993  | Byron ........................... 385/27 |
| 5,392,377 | A |   | 2/1995  | Auracher ..................... 385/24 |
| 5,673,280 | A |   | 9/1997  | Grubb et al. ................... 372/3 |
| 5,680,247 | A |   | 10/1997 | Okuno ......................... 359/341 |
| 5,778,014 | A |   | 7/1998  | Islam ............................. 372/6 |
| 5,815,518 | A |   | 9/1998  | Reed et al. ..................... 372/6 |
| 5,832,006 | A |   | 11/1998 | Rice et al. ....................... 372/3 |
| 5,946,428 | A |   | 8/1999  | Aleksandrov et al. ........ 385/11 |
| 5,959,750 | A |   | 9/1999  | Eskildsen et al. ........... 359/134 |
| 5,966,480 | A |   | 10/1999 | LeGrange et al. ............. 385/27 |
| 5,991,069 | A | * | 11/1999 | Jander ......................... 359/134 |
| 6,038,356 | A |   | 3/2000  | Kerfoot, III et al. .......... 385/24 |
| 6,043,928 | A |   | 3/2000  | Walker et al. ............... 359/337 |
| 6,081,366 | A | * | 6/2000  | Kidorf et al. ................ 359/334 |
| 6,151,160 | A | * | 11/2000 | Ma et al. ...................... 359/124 |
| 6,181,467 | B1 | * | 1/2001 | Jung et al. ............. 359/341.31 |

OTHER PUBLICATIONS

Cho et al. "Dynamically Gain–Flattened Hybrid Optical Amplifier Utilizing Erbium Doped Fiber Amplifier and Semiconductor Optical Amplifier" Sep. 20–24, 1998, ECOC '98. pp. 363–364.*
Leroy et al. "32×10 Gbit/s transmission over 8000 km using hybrid Raman–Erbium doped optical amplifiers" Mar. 7–10, 2000, Optical Fiber Communication Conference, 2000 vol. 1 pp. 143–145.*
"160 Gbit/s (8×20 Gbit/s) DWDM Transmission Over 160 km of Standard Fiber Using a Cascade of Semiconductor Optical Amplifiers," L.H. Spiekman, J.M. Wiesenfeld, A.H. Gnauck, L.D. Garrett, G.N. van den Hoven, T. van Dongen, M.J.H. Sander–Jochem, and J.J.M. Binsma, p. 36.

* cited by examiner

Primary Examiner—Thomas H. Tarcza
Assistant Examiner—Stephen Cunningham
(74) Attorney, Agent, or Firm—Svetlana Short; Brian E. Ainsworth

(57) ABSTRACT

An optical signal amplifier includes a Raman fiber amplifier and a semiconductor optical amplifier. The Raman fiber amplifier utilizes pump radiation to amplify the optical signal resulting in an amplified optical signal. The semiconductor optical amplifier receives the amplified signal amplifying the amplified signal resulting in a twice amplified signal.

30 Claims, 2 Drawing Sheets

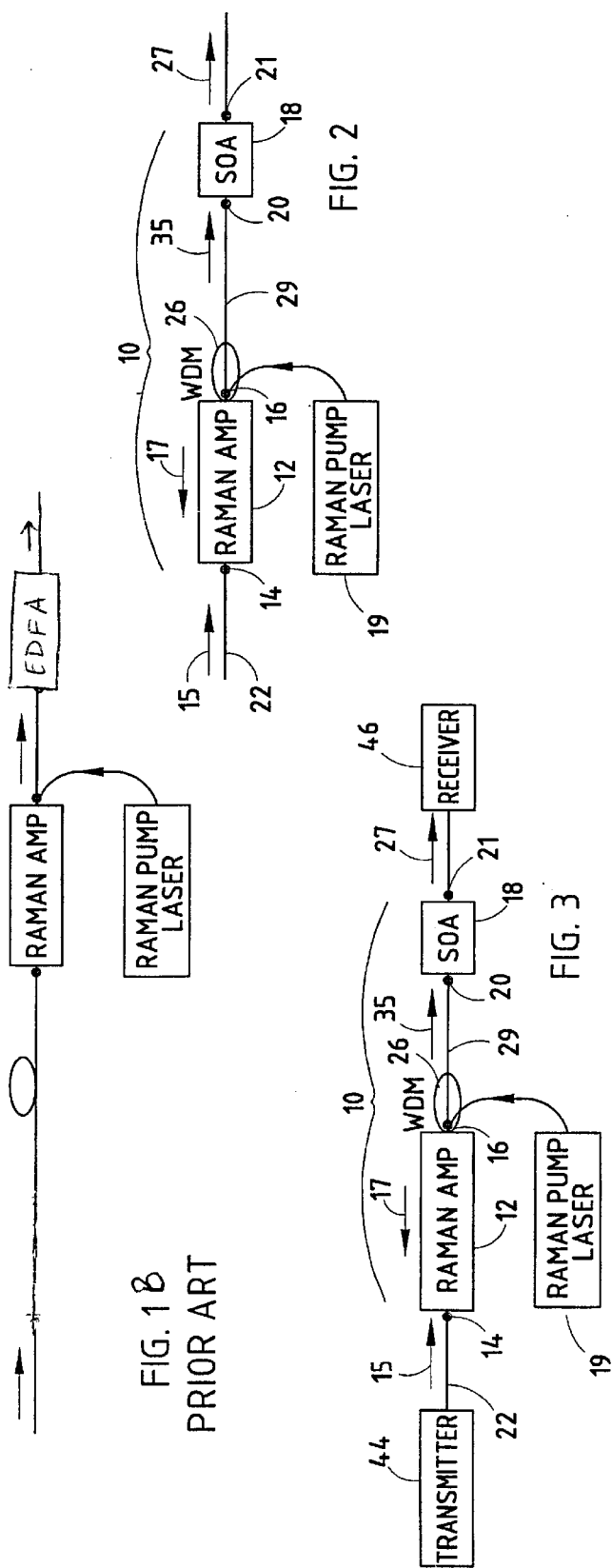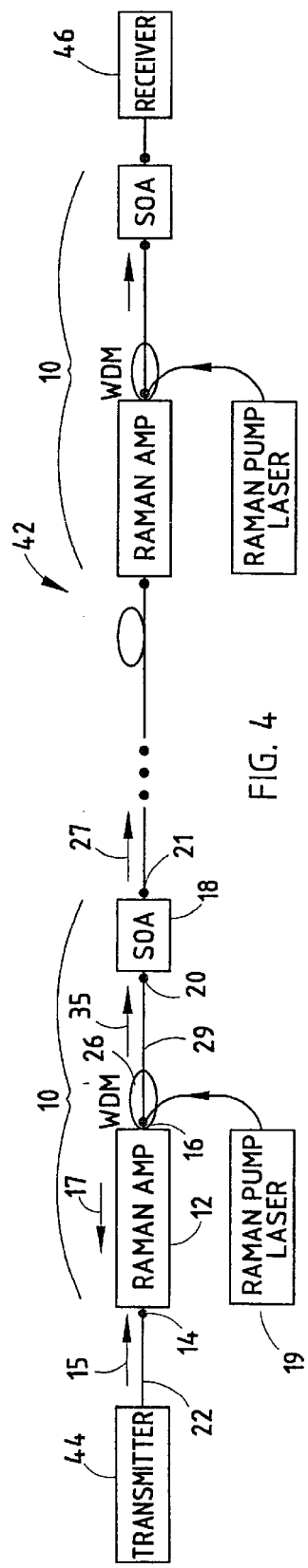

COMPOSITE OPTICAL AMPLIFIER

BACKGROUND OF THE INVENTION

1. Field of the Invention

The invention is directed to a composite optical amplifier, and in particular, to a composite optical amplifier that includes a Raman fiber amplifier and semiconductor optical amplifier.

2. Technical Background

The continuous growth of bandwidth requirements in optical-based communication systems has resulted in a large demand for systems able to operate outside the amplification band provided by Erbium-doped fiber amplifiers. Erbium-doped fiber amplifiers effectively operate over a limited wavelength band. Depending on amplifier configuration and fiber composition, Erbium-doped fiber can be used for amplification in a wavelength band extending from 1530 nm to 1620 nm, a total spectrum of approximately 10 THz, although at least two different erbium-doped fiber amplification configurations would be required to cover this entire range. The 10 THz operating spectrum limits the maximum transmission rate to about 4 Tb/s in current modulation formats.

Other rare earth-doped fiber amplifiers have been used for amplification outside the erbium wavelength band from 1530 nm to 1620 nm. These other rare earth-doped amplifiers include Thulium-doped amplifiers operating from 1440 nm to 1510 nm, Praseodymium amplifiers operating from 1250 nm to 1310 nm and Neodymium amplifiers operating from 1310 nm to 1350 nm. Each of these rare earth-doped amplifiers exhibit very low efficiency as well as other technical problems associated with each particular kind of dopant when compared to Erbium-doped amplifiers.

Rare earth-doped amplification systems cover the available transmission window of traditional silica fiber. However, this transmission window has been expanded with the development of new fibers. In many new fibers, where the OH absorption around 1400 nm has been greatly reduced, there is a potential for optical amplifier configurations which can amplify between an entire optical operating range of from 1100 nm to 1700 nm.

Rare earth-doped fiber amplifiers, including Erbium-doped fiber amplifiers, also have a significant drawback with respect to spacing, or the number of amplifiers required for a given span. Transmission distances ranging from about 100–200 km for a single span system to about 10,000 km for long submarine systems are possible depending on the signal loss between the Erbium-doped amplifiers utilized in the system. Typical long submarine systems have span lengths of about 25–50 km, while typical terrestrial systems have span lengths of about 80–120 km with up to six spans. Both submarine systems and terrestrial systems require a significant number of Erbium-doped amplifiers, or other rare earth-doped amplifiers, thereby adding significant cost to the system.

Two amplifier configurations have been used to amplify wavelength band ranges greater than can be amplified with singular rare earth-doped amplifiers. The first of these is the Raman fiber amplifier which converts laser radiation from a pump laser into amplified signals in another wavelength range through stimulated Raman scattering. More specifically, Raman scattering operates on the principle of Stokes light generation, which is downshifted from the optical pump frequency by an energy determined by vibrational oscillation modes in the atomic structure of the fiber with a transfer of energy to the signal laser, which is at a lower photon energy or longer wavelength than the pump laser. In other words, Raman gain results from the interaction of intense light with optical phonons in the glass, and the Raman effect leads to a transfer of power from one optical beam, or the pump beam, to the signal beam.

A direct consequence of this is that the Raman amplification can be realized at any wavelength in an optical fiber by correct choice of the wavelength of the optical pump.

The gain of the Raman amplifier is determined by the Raman gain coefficient, the pump power, the fiber length and the effective area of the optical mode in the fiber. For high gain, a high gain coefficient, a high pump power and a long fiber length along with a small effective area are required. The Raman gain coefficient for silica fibers is shown in FIG. 1A where the frequency refers to the frequency difference between the Raman pump laser and the laser signal to be amplified. Notably, the gain extends over a large frequency range of up to 40 THz with a broad peak centered at 13.2 THz below the Raman pump frequency. This broad behavior is due to the amorphous structure of the silica glass and means that the Raman effect can be used to effect broad band amplification. The Raman gain depends on the composition of the fiber core and can be varied with different dopant types and concentrations within the fiber.

One of the problems generally associated with Raman amplifiers is the requirement of a relatively large pumping power. Raman amplifiers require a significantly higher optical pump power to achieve the same gain as compared with Erbium-doped fiber amplifiers. In addition, a significant proportion of the optical pump power can be wasted and unused at the fiber output as a result of the inefficiency of Raman pumps. A significant advantage, however, of Raman amplifiers is the low noise figure associated therewith. More specifically, noise figures close to the quantum limit of 3 dB are possible with Raman amplifiers.

It is known to use Raman fiber amplifiers in conjunction with Erbium-doped fiber amplifiers in transmission systems, as shown in FIG. 1B. The use of Raman fiber amplifiers in conjunction with Erbium-doped fiber amplifiers increases the span length between amplifiers and/or permits an upgrade in the link from one bit rate to a higher bit rate. However, while the utilization of distributed Raman amplification in conjunction with Erbium-doped fiber amplifiers alleviates the need for high Raman gain, the utility of such configurations are limited to the effective Erbium window, or to other rare earth windows.

A semiconductor optical amplifier is a second kind of amplifier that can also provide gain over the entire operating transmission window of 1100 nm to 1700 nm. For example, semiconductor optical amplifier components based on the material composite of $Ga_xIn_{1-x}As_yP_{1-y}$ can provide gain within the range of 1000 nm to 1700 nm depending on the relative concentration of the constituent elements.

Optical amplification, including amplification affected by a semiconductor optical amplifier, relies on the known physical mechanisms of population inversion and stimulated emission. More specifically, amplification of an optical signal depends on the stimulated transition of an optical medium from an inverted, excited state to a lower, less excited state. Prior to the actual amplification of the optical signal, a population inversion occurs, i.e., more upper excited states exist than lower states. This population inversion is effected by appropriately energizing the system. In semiconductor optical amplifiers, an excited state is a state in which there exists an electron in the conduction band and a concomitant hole in the valence band. A transition from such an excited state, to a lower state in which neither an electron nor a hole exist, results in the creation of a photon through stimulated emission. The population inversion is depleted every time an optical signal passes through the amplifier and is amplified. The population inversion is then reestablished over some finite period of time. As a result, the gain of the amplifier will be reduced for some given period of time following the passage of any optical signal through the amplifier. This recovery time period is typically denoted as the "gain-recovery time" of the amplifier.

In contrast to Erbium-doped amplifiers, or other rare earth-doped amplifiers, semiconductor optical amplifiers are smaller, consume less power and can be formed in an array more easily. Accordingly, semiconductor optical amplifiers are important in applications such as loss compensation for optical switches used in multi-channel optical transmission systems or optical switchboard systems. In contrast to Raman fiber amplifiers, semiconductor optical amplifiers are electrically pumped and as such, provide very efficient gain.

Two major drawbacks are associated with semiconductor optical amplifiers. The first drawback is that the noise figure associated with semiconductor optical amplifiers is significantly high. While all amplifiers degrade the signal-to-noise ratio of the amplified signal because of amplified spontaneous emission that is added to the signal during amplification, the noise figure associated with semiconductor optical amplifiers is extremely problematic. More specifically, the best achievably intrinsic noise figure for semiconductor optical amplifiers is around 4 dB for devices based on multiple quantum well structures, and around 5 dB for devices based on bulk guiding structures. Further, the coupling loss between semiconductor optical amplifiers and optical fibers is generally 2 to 3 dB. As a result, the best achievable noise figures associated with semi-conductor optical amplifiers are typically somewhere between 6 to 8 dB, depending on the device structure and the coupling configuration.

The second problem associated with semiconductor optical amplifiers is signal cross-talk resulting cross-gain modulation. Signal cross-talk arises because the saturation output power of the semiconductor optical amplifier is lower than that of fiber based amplifiers, and because the gain recovery time is on the same time scale as the data repetition rate. Thus, a semiconductor optical amplifier amplifying multiple signals with a combined input power greater than the input saturation power will superimpose cross-talk caused by gain modulation between the relative channels. However, tests have shown that in many systems performance of semiconductor optical amplifiers are more severely limited by the noise figure associated therewith rather than by cross-talk modulation.

SUMMARY OF THE INVENTION

The invention relates to an optical signal amplifier that includes a Raman fiber amplifier with a semiconductor optical amplifier. More specifically, the present inventive optical amplifier makes use of the low noise figure typically associated with Raman amplifiers and the significant gain typically associated with semiconductor optical amplifiers.

In a preferred embodiment, an optical signal amplifier includes a Raman fiber amplifier having an input for receiving an optical signal and a pump radiation, and an output, wherein the pump radiation amplifiers the optical signal resulting in an amplified optical signal. The optical signal amplifier also includes a semiconductor optical amplifier having an input coupled to the output of the Raman amplifier for receiving the amplified optical signal, wherein the semiconductor optical amplifier amplifies the input signal resulting in a twice amplified signal.

In addition, the disclosed embodiments include an optical communications systems that utilizes the optical signal amplifier, a method for utilization of the compositive optical signal amplifier, as well as the use of a plurality of composite amplifiers in series.

One of the advantages of the optical amplifier of the present invention is that it offers the benefit of a relatively large gain in optical signal strength together with a substantially low noise figure.

BRIEF DESCRIPTION OF THE DRAWINGS

FIG. 1B is a schematic view of a prior art optical amplifier, including an Erbium-doped amplifier and a Raman fiber amplifier;

FIG. 2 is a schematic view of a composite optical amplifier embodying the present invention, including a Raman amplifier and a semiconductor optical amplifier;

FIG. 3 is a schematic view of a fiber optical communication system employing a composite optical amplifier of the present invention; and FIG. 4 is a schematic view of a fiber optic communication system employing a plurality of composite optical amplifiers of the present invention.

DETAILED DESCRIPTION OF THE PREFERRED EMBODIMENT

Figure 1A:
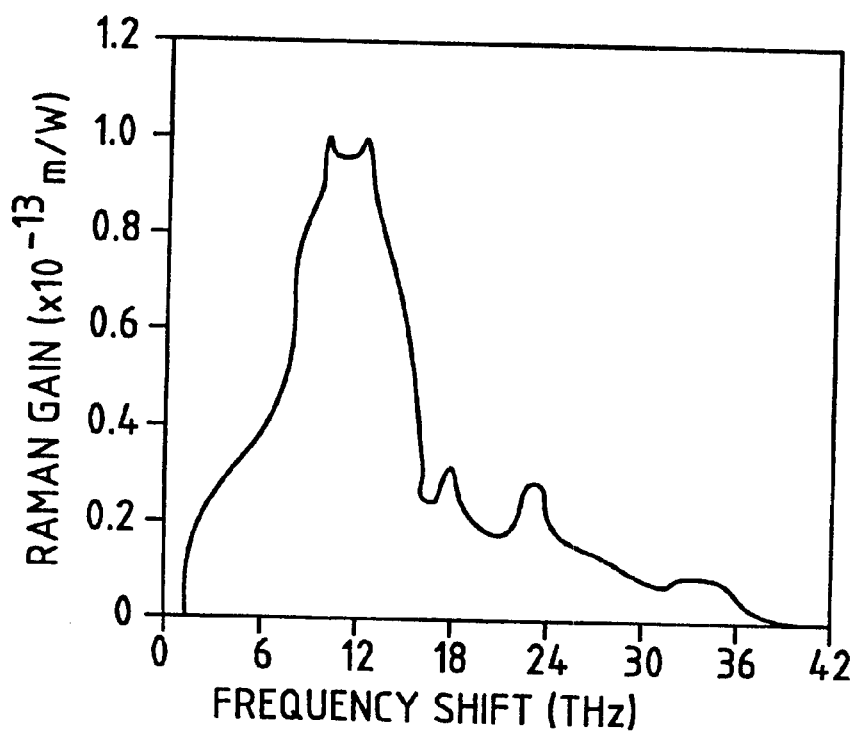
FIG. 1A is a diagram of the Raman gain coefficient for silica fibers.

Additional features and advantages of the invention will be set forth in the detailed description which follows and will be apparent to those skilled in the art from the description or recognized by practicing the invention as described in the description which follows together with the claims and appended drawings.

It is to be understood that the foregoing description is exemplary of the invention only and is intended to provide an overview for the understanding of the nature and character of the invention as it is defined by the claims. The accompanying drawings are included to provide a further understanding of the invention and are incorporated and constitute part of this specification. The drawings illustrate various features and embodiments of the invention which, together with their description, serve to explain the principals and operation of the invention.

Definitions

The following definitions are commonly used in the art.

The single-pass gain of Raman fiber amplifiers is generally defined as, $$G_a = \frac{I_s(L)}{I_s(O)\exp(-\alpha_s L)} = \exp(g_r P_o L_{eff}/A_{eff}),$$

wherein $I_s(0)\exp(-I_s L)$ is the signal intensity at the output of the Raman amplifier in the absence of the pump, $I_s$ is the passive or background signal attenuation coefficient in the Raman fiber; $I_s(L)$ is the signal intensity at the output of the Raman fiber amplifier; $g_r$ is the material dependent gain coefficient; P is the pump power; L is the length of the Raman optical fiber and $A_{eff}$ is the effective area of the optical mode in the fiber.

The effective area is generally defined as, $$A_{eff}=2\pi(\int E^2 \, r \, dr)^2/(\int E^4 \, r \, dr),$$

wherein the integration limits are 0 to ∞, and E is the electric field associated with the propagated light.

The noise figure (linear units) associated with a Raman optical amplifier and a semiconductor optical amplifier is generally defined as, $$F=2n_{sp}/C,$$

wherein $n_{sp}$ is the spontaneous emission factor and C is the input coupling efficiency to the amplifier.

The noise figure in logarithmic or decibel units associated with a Raman optical amplifier and a semiconductor optical amplifier is generally defined as, $$NF(dB)=10*\log_{10}(2n_{sp}/C),$$

wherein $n_{sp}$ is the spontaneous emission factor and C is the input coupling efficiency to the amplifier.

The noise figure of a two stage amplifier (in linear units) is defined as, $$F_{tot} = F_1 + \frac{F_2 - 1}{G_1},$$

wherein $NF_{tot}$ is the noise figure of the composite amplifier, $NF_1$ and $NF_2$ are the individual noise figures of the first and second stage amplifiers, respectively, and $G_1$ is the gain of the first stage.

A composite optical amplifier 10 embodying the present invention is shown in FIG. 2. Composite amplifier 10 includes a Raman optical fiber amplifier 12, having an input 14 for receiving an optical signal traveling in a direction indicated by arrow 15 and an output 16. Raman optical amplifier 12 also receives a pump radiation traveling in a direction indicated by arrow 17 from an optical laser pump 19. The pump radiation amplifies the optical signal within Raman optical amplifier 12 resulting in an amplified optical signal. The composite optical amplifier 10 also includes a semiconductor optical amplifier 18 having an input 20 coupled to output 16 of Raman amplifier 12 by optical fiber 29 for receiving the amplified optical signal. Semiconductor optical amplifier 18 amplifies the amplified signal resulting in a twice amplified signal.

In the illustrated example, a waveguide optical fiber 22 guides the optical signal to input 14 of Raman optical amplifier 12. The optical laser pump 19 generates the pump radiation which is coupled to the optical Raman fiber amplifier 12 via a wave division multiplexer 26. This pump radiation travels in an opposite direction along the Raman fiber amplifier 12 with respect to the optical signal. The pump radiation then attenuates to a theoretical zero as it travels along optical fiber 22. As illustrated, pump 19 includes a Raman optical laser. However, a semiconductor diode laser or other laser emitting device may be substituted. Also, although in the illustrated example wave division multiplexer 26 is used for coupling signals to the composite optical amplifier 10, any coupled capable of combining optical signals of varying wavelengths may be used.

The first stage of the composite optical amplifier is the Raman optical amplifier 12. Only a modest gain is required from Raman optical amplifier 12 because the amplified signal is later re-amplified by semiconductor optical amplifier 18. The relatively low gain required from the Raman optical amplifier 12 relaxes the constraints and requirements of a high pump power that would be required to obtain a high gain from the Raman amplifier 12. In the present example, a gain from Raman optical amplifier 12 within the range of about 3 dB to about 23 dB would be sufficient, however, a gain of between about 12 dB to about 20 dB is preferred.

The amplified signal that exits Raman optical amplifier 12 is then conducted to semiconductor optical amplifier 18 via optical fiber 29 in a direction indicated by arrow 35. The amplified signal is amplified within semiconductor optical amplifier 18 resulting in a twice amplified signal which leaves semiconductor optical amplifier 18 at output 12 in a direction indicated by arrow 27. In the present example, a gain from semiconductor optical amplifier 18 within the range of from about 3 dB to about 20 dB is possible, while a gain of within the range of about 10 dB to 15 dB is preferable. Therefore, the total gain provided by Raman optical amplifier 12 and the semiconductor optical amplifier 18 may range between about 6 dB and about 38 dB, with a preferred total gain of within the range of about 10 dB to about 35 dB.

In optically amplified systems, and particularly systems in which a first amplifier is a distributed Raman amplifier (where the Raman amplifying fiber is the transmission fiber), one needs to define a location at which to measure the noise figure of the first amplifier. In these circumstances, it is convenient to measure the noise figure at the input of the second amplifier, in which case the first amplifier contributes to an effective reduction in the logarithmic noise figure of the second amplifier.

An advantage of the composite optical amplifier 10 is that it provides a noise figure which is dictated by the low noise figure of the Raman optical amplifier 12. This results since the noise generated by an amplifier is a function of the radio of the amount of amplification provided by the amplifier to the non-coherent spontaneous emission generated by the amplifier. As a result, in a two-stage amplifier, where the signal to noise ratio of the first amplifier is small, the noise added by the second-stage amplifier is relatively small with respect thereto, thereby resulting in a low total noise value. In the present example, a noise figure from Raman optical amplifier 12 of between about 3 dB and about 5 dB is obtainable when measured from the input of Raman optical amplifier 12, although a noise figure of no greater than about 4 dB is more easily obtainable. Further, a noise figure from semiconductor optical amplifier 18 of between about 5 dB and about 10 dB is obtainable, although a noise figure of no greater than about 8 dB is more easily obtainable. Therefore, the composite optical amplifier 10 provides a preferred noise figure of no greater than 4.3 dB, with Raman optical amplifier 12 providing between about −2 dB and about −4 dB to the total overall noise figure of composite optical amplifier 10, when measured at the input to the second stage amplifier.

As shown in FIG. 3, and in accordance with the present invention, the composite optical amplifier 10 is constructed and configured in accordance with the present invention and used in an optical communication system 42. System 42 includes a transmitter 44 and a remote receiver 46. Transmitter 44 transmits an optical signal via optical fiber 22 to composite optical amplifier 10, which in turn is coupled to receiver 46 after being amplified by composite optical amplifier 10. The communications system 42 may also include a plurality of spaced apart series coupled composite optical amplifiers 10, as shown in FIG. 4. Each composite optical amplifier 10 includes a Raman fiber amplifier 12 in paired relationship with a semiconductor optical amplifier 18. These composite optical amplifiers 10 are placed in optical communication and in series with one another between transmitter 44 and receiver 46, with a spacing of about 80–120 km with respect to terrestrial applications, and a spacing of about 25–50 km with respect to submarine applications.

The composite optical amplifiers described herein are effective for amplifying optical signals through any wavelengths within the usable optical signal wavelength range. The composite optical amplifier relaxes the constraints of a high power pump such as that required for solely Raman amplification, while reducing the noise association with a solely semiconductor optical amplification. The composite optical amplifiers described herein also reduce the costs of original amplification when compared to Erbium-doped amplifiers and Raman optical amplifiers. Further, the composite optical amplifiers described herein present a smoother optical gain profile when compared with Erbium-doped amplifiers and Raman optical amplifiers, thereby reducing the difficulty in designing gain flattering filters. The Raman optical amplifiers referred to herein include the distributed Raman fiber amplifiers and the discrete Raman fiber amplifiers.

It will become apparent to those skilled in the art that various modifications to the preferred embodiment of the invention as described herein can be made without departing from the spirit or scope of the invention as defined by the appended claims.

The invention claimed is:

1. An optical signal amplifier, comprising:
    a Raman fiber amplifier having an input for receiving an optical signal traveling in a first direction, an output, and a source of pump radiation coupled to the Raman fiber amplifier and providing pump radiation traveling in a second direction different from the first direction, wherein the pump radiation amplifies the optical signal resulting in an amplified optical signal; and
    a semiconductor optical amplifier having an input coupled to the output of the Raman amplifier for receiving the amplified optical signal, wherein the semiconductor optical amplifier further amplifies the signal resulting in a twice amplified signal.

2. The optical amplifier of claim 1, wherein the optical signal amplifier has an associated overall noise figure, and wherein the Raman fiber amplifier contributes an associated first noise figure to the overall noise figure within the range of from about −2 dB to about −4 dB.

3. The optical signal amplifier of claim 1, wherein the Raman fiber amplifier has a length within the range of from about 1 km to about 10 km.

4. The optical signal amplifier of claim 2, wherein the semiconductor optical amplifier contributes an associated second noise figure to the overall noise figure within the range of from about 5 dB to about 10 dB.

5. The optical signal amplifier of claim 4, wherein the second noise figure of the semiconductor optical amplifier is equal to or less than about 8 dB.

6. The optical amplifier of claim 4, wherein the amplified signal includes a gain from the Raman fiber amplifier within the range of from about 0 dB to about 23 dB.

7. The optical signal amplifier of claim 6, wherein the amplified signal includes a gain from the Raman fiber amplifier within the range of from about 12 dB to about 20 dB.

8. The optical signal amplifier of claim 6, wherein the twice amplified signal includes a gain from the semiconductor optical amplified within the range of from about 0 dB to about 15 dB.

9. The optical signal amplifier of claim 8, wherein the twice amplified signal includes a gain from the semiconductor optical amplifier within the range of from about 10 dB to about 15 dB.

10. The optical signal amplifier of claim 8, wherein the twice amplified signal includes a gain from the optical signal amplifier within the range of from about 0 dB to about 38 dB.

11. The optical signal amplifier of claim 10, wherein the twice amplified signal includes a gain from the optical signal amplifier within the range of about 10 dB to about 35 dB.

12. A method for amplifying an optical signal, comprising:
    providing a Raman medium;
    conducting at least one optical signal through the Raman medium;
    amplifying the optical signal by providing a pump radiation to the Raman medium, wherein the pump radiation amplifies the optical signal resulting in an amplified optical signal;
    providing a semiconductor optical amplifier in optical communication with the Raman medium; and
    additionally amplifying the optical signal by the semiconductor optical amplifier resulting in a twice amplified optical signal.

13. The method described in claim 12, wherein the Raman medium providing step 1 includes providing an optical waveguide fiber.

14. The method described in claim 12, wherein the step of conducting at least one optical signal through the Raman medium includes conducting a plurality of optical signals of different wavelength through the Raman medium, the step of amplifying the optical signal includes amplifying the plurality of optical signals, wherein the step of additionally amplifying the optical signal includes amplifying the plurality of amplified optical signals.

15. The method described in claim 12, wherein the optical fiber of the step of providing the Raman medium includes providing the optical fiber with a length within the range of about 1 km to about 10 km.

16. The method described in claim 12, and further including:
    providing a plurality of Raman mediums;
    providing a plurality of semiconductor optical amplifiers in paired relationship with the plurality of Raman mediums; and
    placing the paired Raman mediums and semiconductor optical amplifiers in optical communication with one another.

17. The method described in claim 13, wherein the step of amplifying the optical signal produces a first noise figure reduction within the amplified optical signal from about −2 dB to about −4 dB.

18. The method described in claim 17, wherein the step of amplifying the optical signal results in the amplified optical signal including a gain within the range from about 0 dB to about 23 dB.

19. The method described in claim 18, wherein the step of amplifying the optical signal results in the amplified signal including a gain within the range from about 12 dB to about 20 dB.

20. The method described in claim 18, wherein the step of additionally amplifying the optical signal produces a second noise figure within the twice amplified signal from the semiconductor optical amplifier within the range from about 5 dB to about 10 dB.

21. The method described in claim 20, wherein the step of additionally amplifying the amplified signal produces a second noise figure within the twice amplified signal from the semiconductor optical amplifier of less than or equal to about 8 dB.

22. The method described in claim 20, wherein the steps of amplifying the signal and of additionally amplifying the signal produces a total noise figure of less than or equal to about 4.3 dB.

23. An optical communications system, comprising:
   an optical signal transmitter;
   a first waveguide optical fiber for guiding an optical signal generated by the transmitter;
   a Raman fiber amplifier optically coupled to the optical waveguide fiber;
   a source of pump radiation coupled to the Raman fiber amplifier providing pump radiation to said Raman fiber amplifier, wherein the pump radiation amplifies the optical signal resulting in an amplified optical signal;
   a semiconductor optical amplifier in optical communication with the Raman fiber amplifier, wherein the semiconductor optical amplifier amplifies the amplified signal resulting in a twice amplified signal;
   a second waveguide optical fiber for guiding the twice amplified signal; and
   an optical signal receiver for receiving the twice amplified signal.

24. The communications system of claim 23, wherein the twice amplified signal includes an overall noise figure, and wherein the Raman fiber amplifier contributes an associated first noise figure to the overall noise figure within the range of from about −2 dB to about −4 dB.

25. The communications system of claim 23, wherein the overall noise figure is about 4.3 dB.

26. The communications system of claim 23, wherein the Raman fiber amplifier has a length within the range of about 1 km to about 10 km.

27. The communications system of claim 23, and further comprising:
   providing a plurality of Raman mediums;
   providing a plurality of semiconductors optical amplifiers in paired relationship with the plurality of Raman mediums; and
   placing the paired Raman mediums and semiconductor optical amplifiers in serial optical communication in spaced relationship with one another.

28. The communications system of claim 24, wherein the semiconductor optical amplifier contributes an associated second noise figure to the overall wave figure within the range of from about 5 dB to about 10 dB.

29. The communications system of claim 28, wherein the twice amplified signal includes a gain from the Raman amplifier within the range of from about 0 dB to about 23 dB.

30. The communications system of claim 29, wherein the twice amplified signal includes a gain from the semiconductor optical amplifier within the range of from about 0 dB to about 15 dB.

* * * * *